(12) United States Patent
Chen

(10) Patent No.: US 10,658,564 B2
(45) Date of Patent: May 19, 2020

(54) SURFACE ACOUSTIC WAVE DEVICE

(71) Applicant: Zhuohui Chen, Ottawa (CA)

(72) Inventor: Zhuohui Chen, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 217 days.

(21) Appl. No.: 15/361,054

(22) Filed: Nov. 24, 2016

(65) Prior Publication Data

US 2018/0145657 A1    May 24, 2018

(51) Int. Cl.
*H01L 41/08* (2006.01)
*H03H 9/02* (2006.01)
*H03H 3/08* (2006.01)

(52) U.S. Cl.
CPC ............. *H01L 41/081* (2013.01); *H03H 3/08* (2013.01); *H03H 9/02574* (2013.01)

(58) Field of Classification Search
CPC ..... H01L 41/081; H01L 41/0477; H03H 3/08; H03H 9/02574
USPC ...... 310/313 R, 313 A, 313 B, 313 C, 313 D
See application file for complete search history.

(56) References Cited

U.S. PATENT DOCUMENTS

| | | | |
|---|---|---|---|
| 4,752,709 A | 6/1988 | Fujishima et al. | |
| 5,235,233 A | 8/1993 | Yamamoto | |
| 5,274,345 A | 12/1993 | Gau | |
| 5,576,589 A | 11/1996 | Dreifus et al. | |
| 5,838,090 A * | 11/1998 | Nakahata ........... | H03H 9/02582 310/313 A |
| 5,965,969 A * | 10/1999 | Kadota ................. | H03H 9/25 310/313 R |
| 6,984,918 B1 * | 1/2006 | Hachigo ............ | H03H 9/02574 310/313 A |
| 8,165,682 B2 | 4/2012 | Gopalsami et al. | |
| 8,378,553 B1 | 2/2013 | Naumenko et al. | |
| 2003/0001696 A1 | 1/2003 | Yoshida et al. | |
| 2003/0030119 A1 | 2/2003 | Higgins, Jr. et al. | |
| 2007/0182279 A1 | 8/2007 | Kawano et al. | |
| 2007/0296304 A1 | 12/2007 | Fujii et al. | |

(Continued)

FOREIGN PATENT DOCUMENTS

| | | |
|---|---|---|
| CN | 1645744 A | 7/2005 |
| CN | 102437832 A | 5/2012 |

(Continued)

OTHER PUBLICATIONS

"Aluminum Nitride Thin Film Acoustic Wave Device for Microfluidic and Biosensing Applications" by Fu et al. Acoustic Waves Book edited by Don W. Dissanayake, ISBN 978-953-307-111-4, pp. 466, Sep. 2010.

(Continued)

*Primary Examiner* — Derek J Rosenau

(57) ABSTRACT

The embodiments herein relate to surface acoustic wave (SAW) devices, such as filters and duplexers. The SAW device may have a high acoustic velocity layer and a piezoelectric layer coupled to the high acoustic velocity layer. At least one transducer is coupled at least to the piezoelectric layer, where the transducer propagates a surface acoustic wave having an operating wavelength along a surface of the piezoelectric layer. A metallic layer may be coupled to the surface of the piezoelectric layer and electrically isolated from the transducer.

27 Claims, 13 Drawing Sheets

(56) References Cited

U.S. PATENT DOCUMENTS

| | | | | |
|---|---|---|---|---|
| 2015/0069882 A1* | 3/2015 | Umeda | ............. | H03H 9/02574 310/313 B |
| 2015/0123746 A1 | 5/2015 | Nakamura et al. | | |
| 2015/0365067 A1* | 12/2015 | Hori | ................... | H03H 9/02228 333/193 |
| 2016/0126927 A1 | 5/2016 | Lee et al. | | |

FOREIGN PATENT DOCUMENTS

| | | |
|---|---|---|
| CN | 106160691 A | 11/2016 |
| EP | 1225693 A1 | 7/2002 |

OTHER PUBLICATIONS

"High Q surface acoustic wave resonators in 2-3 GHz range using ScAlN-single crystalline diamond structure" by Hashimoto et al. (Conf.: Ultrasonics Symposium (IUS), 2012 IEEE International).

"Surface acoustic wave propagation characteristics of ScAlN/ diamond structure with buried electrode" by Zhang et al. (Piezoelectricity Acoustic Waves and Device Applications (SPAWDA) 2014 Symposium on, pp. 271-274, 2014).

"Saw Characteristics of AlN Films Sputtered on Silicon Substrates" by Clement, M. et al. Ultrasonics 42 (2004) 403-407.

"Piezoelectric thin AlN films for bulk acoustic wave (BAW) resonators" by Loebl, H.P. et al. Materials Chemistry and Physics 79 (2003) 143-146.

"Saw Impedance Element Filters for 5 GHz and beyond" by Lehtonen, S. et al. 1999 IEEE Ultrasonics Symposium, pp. 395-399.

"High-Performance Surface Acoustic Wave Resonators in the 1 to 3 GHz Range Using a ScAlN/6H-SiC Structure" by Hashimoto, K. et al. IEEE Trans. on Ultrasonics, Ferroelectrics and Frequency Control, vol. 60, No. 3, Mar. 2013.

"SAW Propagation Characteristics and Fabrication Technology Piezoelectric Thin Film / Diamond Structure" by Yamanouchi, K. et al. IEEE 1989 Ultrasonics Symposium. pp. 351-354.

\* cited by examiner

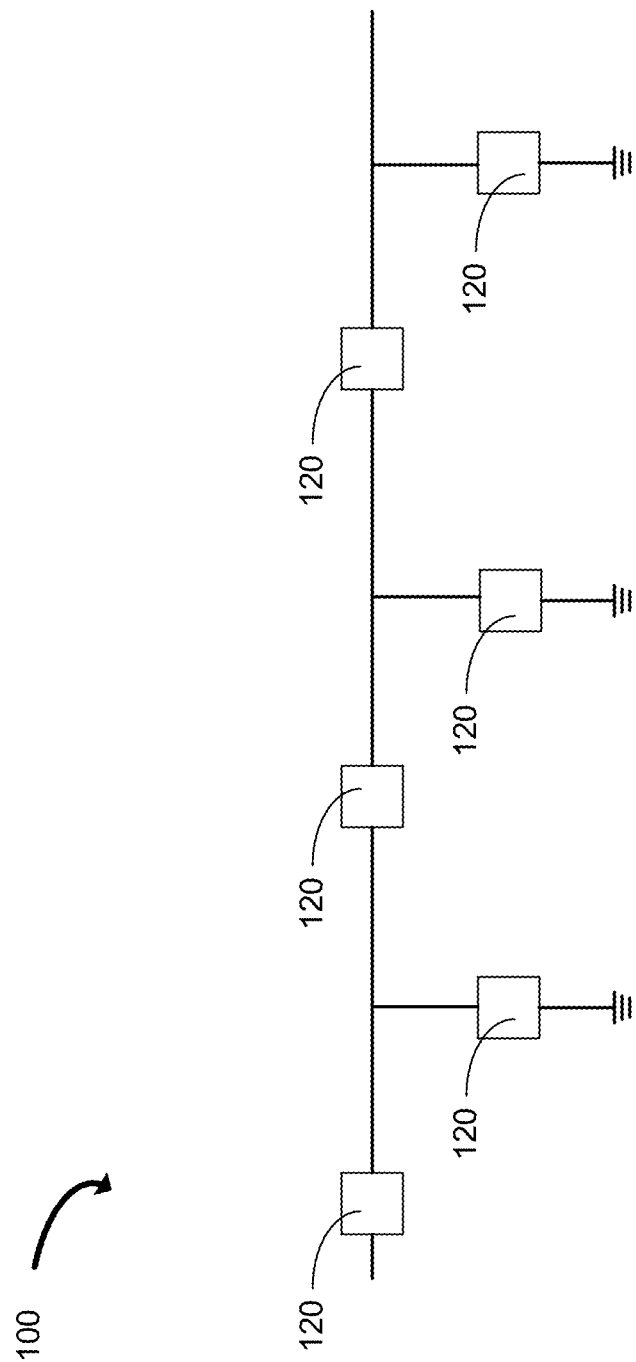

SURFACE ACOUSTIC WAVE DEVICE

FIELD

The embodiments disclosed herein relate to surface acoustic wave (SAW) devices. In particular, the embodiments relate to SAW filters, resonators, and/or duplexers with improved electromechanical coupling and surface wave velocity.

BACKGROUND

In communication systems (both terminal and base station infrastructure), surface acoustic wave (SAW) filters and resonators are widely used. For new standards such as the E-UTRA used in the 5G-TG4-CA, there is growing demand for higher operating frequency, lower insertion loss, higher transmitting power, and/or wider channel bandwidth. New piezoelectric materials or structures are desirable to support the growing demand for higher frequency and wider channel bandwidth. In particular, a high electromechanical coupling coefficient for SAW filters may be desirable.

One of the factors that affect the filter bandwidth is the piezoelectric material's electromechanical coupling coefficient ($k^2$). The higher the electromechanical coupling coefficient, $k^2$, the wider the filter bandwidth may be. Aluminum Nitride (AlN)/diamond multi-layer structures have been suggested may have a very high acoustic wave velocity of about 9500 m/s at AlN thickness of 0.35 wavelength, $\lambda$. However, the relatively small $k^2$ of 1.2% may be unsuitable for wideband filter and duplexer application.

Scandium-doped AlN (ScAlN) films have been attempted due to their high piezoelectricity, high thermal conductivity, and relatively high acoustic wave velocity. One such structure is described in "*High Q surface acoustic wave resonators in 2-3 GHz range using ScAlN-single crystalline diamond structure*" by Hashimoto et al. (Conf.: Ultrasonics Symposium (IUS), 2012 IEEE International), herein expressly incorporated by reference in its entirety.

Similarly, another such structure is described in "*Surface acoustic wave propagation characteristics of ScAlN/diamond structure with buried electrode*" by Zhang et al. (Piezoelectricity Acoustic Waves and Device Applications (SPAWDA) 2014 Symposium on, pp. 271-274, 2014), herein expressly incorporated by reference in its entirety.

These structures have been explored but have not been adequate to address the specific challenges as described herein.

SUMMARY

The embodiments described below may provide a SAW filter with relative bandwidth of up to 6.0%. In particular, using the techniques described herein, a SAW filter may meet the requirements of an E-UTRA band 42 filter (e.g. center frequency ($f_o$) of 3500 MHz or greater and bandwidth ($BW_{3db}$) of 200 MHz or greater). The embodiments described herein may obtain a wideband SAW filter, such as the E-UTRA band 42 filter (e.g., with $f_o$=3.5 GHz, $BW_{3db}$=200 MHz), using a piezoelectric structure with high electromechanical coupling coefficient $k^2$. The embodiments described herein may also achieve additional benefits and advantages not explicitly stated herein.

In some embodiments, the present disclosure describes a SAW device. The SAW device includes a high acoustic velocity layer and a piezoelectric layer coupled to the high acoustic velocity layer. The SAW device also includes at least one transducer coupled to at least the piezoelectric layer. The transducer is configured to propagate a surface acoustic wave having an operating wavelength ($\lambda$) along a surface of the piezoelectric layer. The SAW device also includes a metallic layer coupled to the piezoelectric layer and electrically isolated from the at least one transducer.

In some embodiments, the at least one transducer may be provided between the piezoelectric layer and the high acoustic velocity layer.

In some embodiments, the SAW device may include a base layer coupled to the high acoustic velocity layer.

In some embodiments, the at least one transducer includes an input transducer and an output transducer.

In some embodiments, the present disclosure describes a method for manufacturing a SAW device. The method includes providing a high acoustic velocity layer and providing a pair of transducers on the high acoustic velocity layer. The transducers are configured to propagate or receive a surface acoustic wave and having an operating wavelength. The method also includes providing a piezoelectric layer over the pair of transducers and the high acoustic velocity layer. The method also includes providing a metallic layer on the piezoelectric layer.

BRIEF DESCRIPTION OF THE DRAWINGS

Reference will now be made, by way of example, to the accompanying drawings which show example embodiments of the present application, and in which:

FIG. 1B is schematic view of an example ladder-type SAW filter;

Similar reference numerals may have been used in different figures to denote similar components.

DESCRIPTION OF EXAMPLE EMBODIMENTS

Figure 1A:
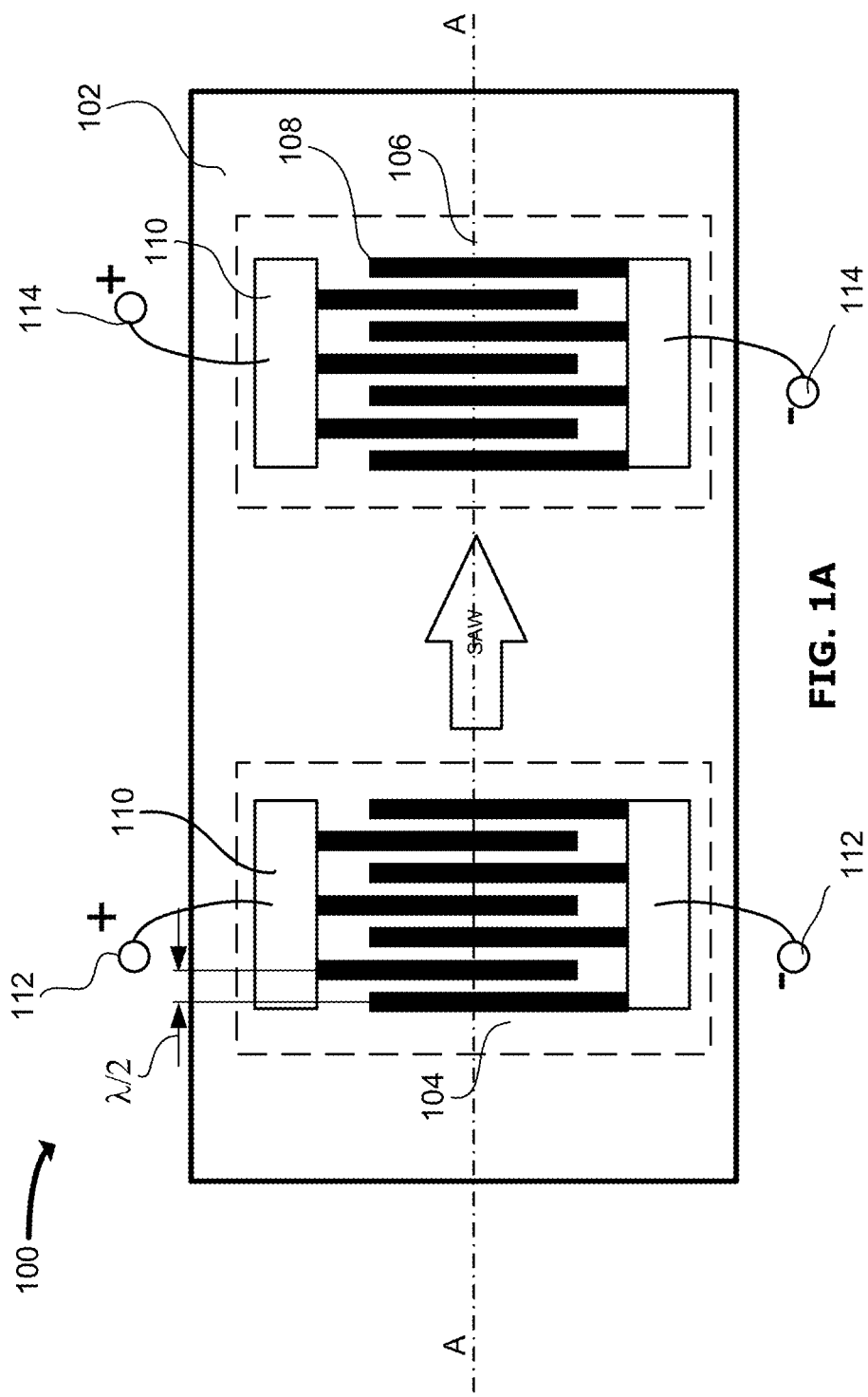
FIG. 1A is a top plan view of an example SAW filter.

An example of a physical implementation of a surface acoustic wave (SAW) device 100, such as for example a transversal filter or a resonator filter, is shown in FIGS. 1A and 1B respectively. Although the description below is described with reference to particular SAW device 100, the techniques described herein may equally apply to other types of SAW filters and/or resonators. For example, any SAW transducer, interdigital transducer (IDT), Inter-digitated Inter-digital transducer (IIDT), ladder-type filter, or others may incorporate the multi-layer structure(s) described herein.

With reference to a particular examples demonstrated in FIG. 1A, the SAW device 100, in this example embodiment a basic filter, may include a multi-layered body 102 (as discussed further below) with an input transducer 104 and an output transducer 106, each indicated by their respective dashed box. The input transducer 104 and the output transducer 106 may be coupled to the body 102. The input transducer 104 and the output transducer 106 each comprise a plurality of electrically conductive interdigital transducer (IDT) electrodes 108. The IDT electrodes 108 may be generally parallel to each other within their respective transducer 104/106 and each of the fingers of each IDT electrode 108 may be spaced by half of an operating wavelength (λ/2). The IDT electrodes 108 of the input transducer 104 and output transducer 106 may also be generally parallel to each other. The IDT electrodes 108 may be electrically coupled to lead-out bonding pad 110 for either supplying power to the IDT electrodes 108 by way of input terminals 112 (in the case of the input transducer 104) or receiving power by way of output terminals 114 from the IDT electrodes 108 (in the case of the output transducer 106). The IDT electrodes 108 may have an IDT thickness between approximately 0λ and approximately 0.10λ. In the present disclosure, a layer or material may be as having a thickness of approximately 0λ to indicate that the layer or material provides zero electrical potential and no mechanical mass-loading effect (e.g., for simulation purposes); a thickness of approximately 0λ does not indicate that the layer or material is omitted.

When power is supplied to input terminals 112, the IDT electrodes 108 of the input transducer 104 convert the electrical energy into a SAW (e.g. transduction) propagating along the body 102. The SAW may be carried across the body 102 and the SAW may be converted back into an electrical signal by the IDT electrodes 108 of the output transducer 106. The electrical signal may then be provided at the output terminals 114, for example to be received by a processor (not shown) via an analog-to-digital converter (not shown). The center frequency of a SAW filter may be given by the velocity of the SAW divided by the operating wavelength.

Figure 1C:
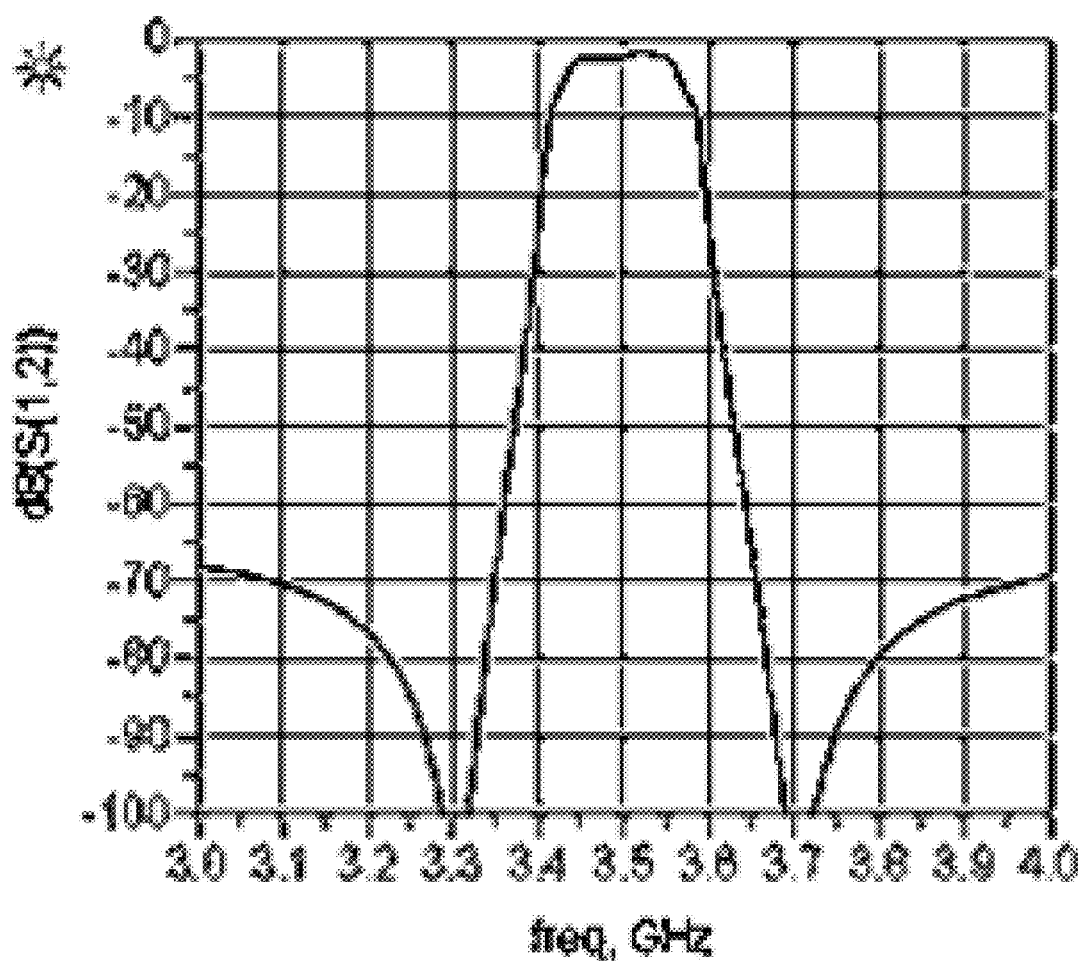
FIG. 1C is a chart showing simulation results of the ladder-type SAW filter of FIG. 1B.

Turning now to FIG. 1B, a ladder-type SAW filter 100 comprises a number of SAW resonators 120 that may be electrically connected in a ladder configuration. This ladder-type SAW filter 100 was simulated using the parameters of the simulation of the structure presented in FIG. 2 described in further detail below. The response for this simulation is presented in FIG. 1C and demonstrates that this ladder-type SAW filter 100 may achieve the performance requirements of the E-UTRA band 42. The response demonstrates a center frequency of approximately 3.5 GHz and a relatively flat pass-band of approximately 200 MHz.

Figure 2:
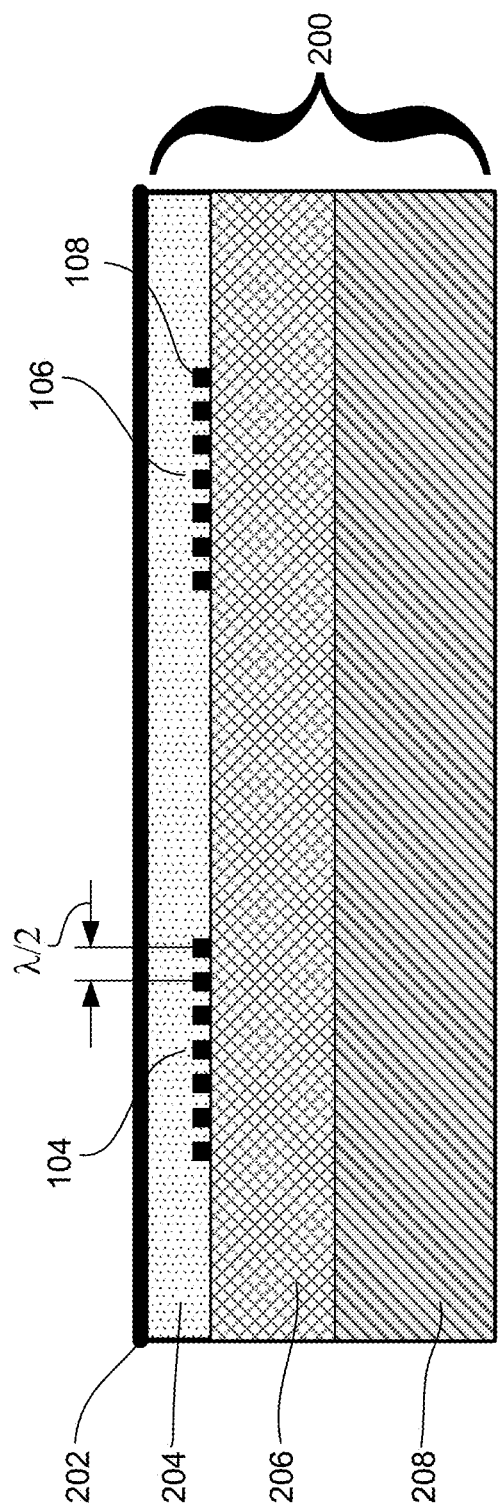
FIG. 2 is a side cross-section view of the SAW filter of FIG. 1A.

FIG. 2 illustrates a side sectional view of the SAW device 100 along line A-A. The multi-layered body 102 of the SAW device 100 may comprise four layers 200: a base layer 208, a high acoustic velocity layer 206 (e.g., a diamond layer), a piezoelectric layer 204 (e.g., scandium-doped aluminum-nitride (ScAlN) film), and a metallic layer or surface 202.

The IDT electrodes 108 may be any suitable conductive material (e.g., copper (Cu)). The thickness of the piezoelectric layer 204 ($h_{ScAlN}$) may be less than the operating wavelength and may be between approximately 0.15λ and 0.25λ for an IDT electrode 108 thickness ($h_{Cu}$) of less than or equal to approximately 0.06λ. In other example embodiments, the thickness of the piezoelectric layer 204 may be 0.2λ and the IDT electrode 108 thickness may be between approximately 0λ and approximately 0.10λ as may be observed in FIG. 5, which shows results of a simulation described further below. The thickness of the high acoustic velocity layer 206 may be greater than one operating wavelength. For the examples provided herein, the operating wavelength may be between approximately 1 μm and approximately 4 μm.

Figure 10:
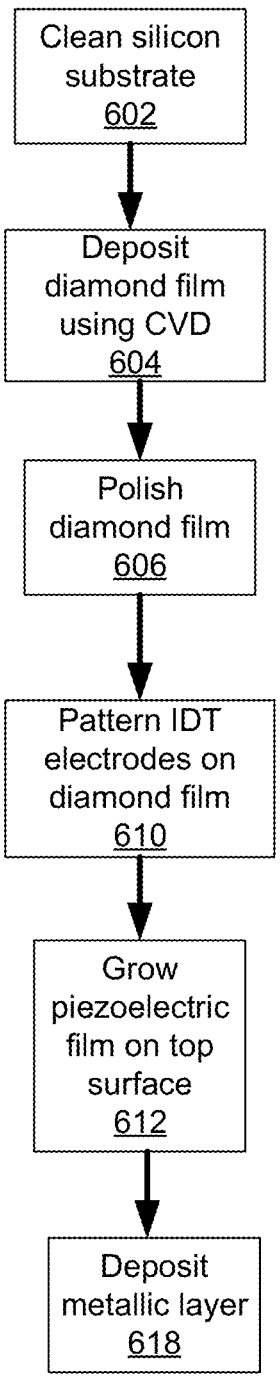
FIG. 10 is a flowchart demonstrating an example method of manufacture of the example SAW filter presented in FIG. 2.

The layers 200 may be provided on top of each other generally using any suitable semiconductor manufacturing techniques as further described with reference to FIG. 10 below. The base layer 208 may comprise a silicon substrate where a high acoustic velocity layer 206 may be placed. The high acoustic velocity layer 206 may enable a high acoustic velocity (e.g. 10,000 m/s) for the SAW and may enable a high operating frequency. In this embodiment, the IDT electrodes 108 may be placed on the high acoustic velocity layer 206 and may be encased in a thin piezoelectric layer 204 comprising a scandium-doped aluminum nitride. In one example, the piezoelectric layer 204 comprises a $Sc_{0.41}Al_{0.59}N$ (e.g. Sc-doped AlN with Sc content of 41 atomic percent (at %) and Al content of 51 at %). The piezoelectric layer 204 may be less than one wavelength (λ). When the piezoelectric layer 204 is below a cutoff thickness, no wave mode may be detected due to the low electromechanical coupling coefficient ($k^2$). When the thickness of the piezoelectric layer 204 is increased, the electromechanical coupling coefficient may gradually improve for particular wave modes as described further below. As the piezoelectric layer 204 increases in thickness over one wavelength, the underlying high acoustic velocity layer 206 may have a diminishing benefit to the operation of the SAW device 100. When the thickness of the piezoelectric layer 204 increases beyond about 3 wavelengths in height, the piezoelectric layer 204 may be viewed as semi-infinite and the high acoustic velocity layer 206 may provide negligible benefit to the SAW device 100.

The top layer in this embodiment is a metallic layer 202. The metallic layer 202 may completely encompass the IDT electrodes 108 and may provide an electrical short boundary condition (e.g. zero electrical potential boundary condition). In the example embodiments, a metallic material may be selected for the metallic layer 202 having a high electric conductance and a high acoustic velocity. For example, the metallic layer 202 may be copper, aluminum, beryllium, or molybdenum. In some example embodiments where the metallic layer 202 may have a thickness much less than the thickness of the piezoelectric layer 204, the acoustic properties of the metallic material may have a lesser importance compared to the electrical properties of the metallic material.

For a SAW device 100 made using a very thin piezoelectric layer 204 such as described in the embodiments herein, the acoustic wave may penetrate deeper into the high acoustic velocity layer 206 as the thickness of the piezoelectric layer 204 is less than one wavelength. The energy of the SAW may be largely dissipated in the high acoustic velocity layer 206 where the wave predominantly propagates. When the thickness of the piezoelectric layer 204 is increased, the acoustic velocity gradually changes to that of the piezoelectric layer 204.

The example embodiment demonstrated in FIG. 2 was simulated using the commercial finite element software, COMSOL Multiphysics. The simulations, equations, and graphs used or presented herein are merely for demonstration and illustration only and are not intended to be limiting. The simulated parameters were for a piezoelectric layer 204 of a $Sc_{0.41}Al_{0.59}N$. The material constants for $Sc_{0.41}Al_{0.59}N$ that were used in the simulations may be found in "High-performance surface acoustic wave resonators in the 1 to 3 GHz range using a ScAlN6H—SiC structure", Hashimoto et al., IEEE Trans. On Ultrasonics, Ferroelectrics and Frequency Control, Vol. 60, No. 3, March 2013, incorporated herein by reference in its entirety. The material constants for diamond that were used in the simulations may be found in "SAW propagation characteristics and fabrication technology of piezoelectric thin film diamond structure", Yamanouchi, K. et al. IEEE 1989 Ultrasonics Symposium. pp. 351-354, incorporated herein by reference in its entirety. The high velocity acoustic layer 206 thickness, being greater than $\lambda$, was treated as semi-infinite and the normalized piezoelectric layer 204 thickness ($h_{ScAlN}/\lambda$) is the x-axis variable in FIGS. 4A to 4F. The metallic layer 202 thickness on the surface may be approximately zero (e.g. provides a zero electrical potential and no mechanical mass-loading effect) in comparison to the operating wavelength. The base layer 208 was not included in the simulation as it was assumed the high velocity acoustic layer 206 thickness was semi-infinite, therefore the effect of base layer 208 to the performance of the overall SAW device 100 may be considered negligible. The base layer 208 serves as a supporting substrate to grow the high acoustic velocity layer 206 on top of it and may be replaced with other substrates or even omitted (e.g., in examples where the high velocity acoustic layer 206 is sufficiently thick to be self-supporting).

The electromechanical coupling ($k^2$) was calculated from the following equation:

$$k^2 = \left(\frac{\pi f_r}{2 f_a}\right) \bigg/ \tan\left(\frac{\pi f_r}{2 f_a}\right) \quad (1)$$

Where $f_r$ and $f_a$ are the resonance frequency and the anti-resonance frequency of the SAW device. In the simulation, the thickness of the piezoelectric layer 204 was varied from $0.10\lambda$ to $1.0\lambda$ for each IDT transducer 104/106 thickness (e.g. electrode thickness $h_{cu}$) of $0\lambda$, $0.02\lambda$, $0.04\lambda$, $0.06\lambda$, $0.08\lambda$, and $0.10\lambda$. The results of these simulations are presented in FIG. 4A to 4F respectively.

As may be observed from FIGS. 4A to 4F, different wave modes provide particular advantages for the electromechanical coupling coefficients for different heights of the piezoelectric layer 204 and IDT electrode 108 thickness. Generally, as the IDT electrode 108 thickness increases, the electromagnetic coupling coefficient decreases. In some embodiments, a Rayleigh wave (also called the fundamental mode or mode 1 in these embodiments) may generally be created when the piezoelectric layer 204 may be thin. With increasing piezoelectric layer 204 thickness, some higher order acoustic wave modes may propagate better than Rayleigh waves. For example in FIGS. 4A to 4F, a mode 2 wave, also known as a Sezawa wave in these embodiments, may propagate better than a Raleigh wave in a layered structure, as described with reference to FIG. 2, for a high acoustic velocity layer with a higher acoustic velocity than the overlying piezoelectric layer 204. The Sezawa wave may exhibit a larger phase velocity (e.g. higher resonant frequency) than the Rayleigh wave for similar thicknesses, and thus may be desirable for some higher frequency applications. Generally, in some embodiments it is desirable to choose a wave mode that has a high electromagnetic coupling coefficient where the other wave modes have a low electromagnetic coupling coefficient in order to limit spurious or unwanted signals in the SAW device 100.

Figure 4A:
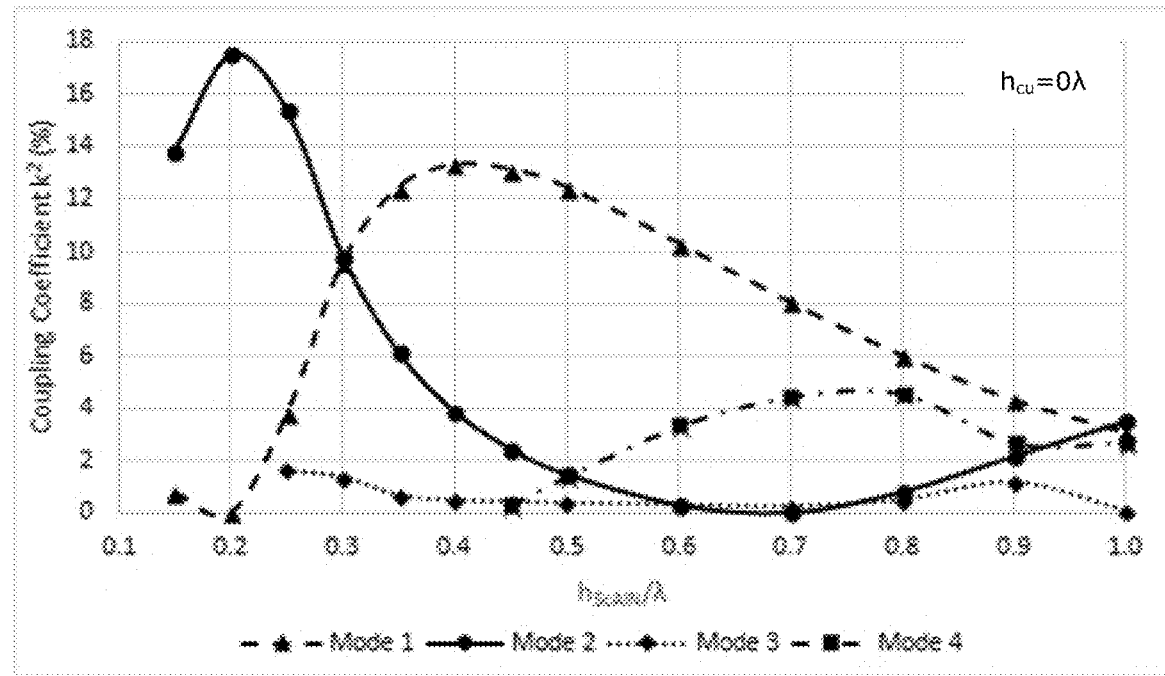
FIGS. 4A to 4F are simulated plots of the coupling coefficient versus the height of the scandium-doped Aluminum Nitride (ScAlN) layer for four wave modes with different interdigital electrode heights for the example presented in FIG. 2.
Figure 4B:
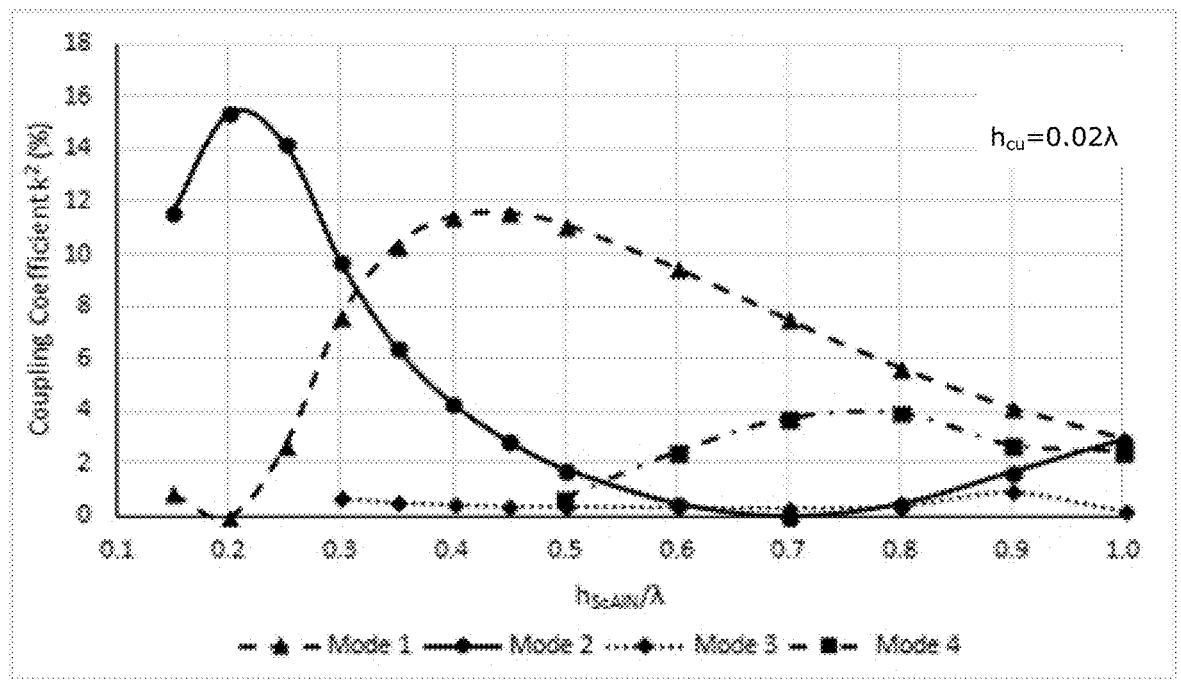
Figure 4C:
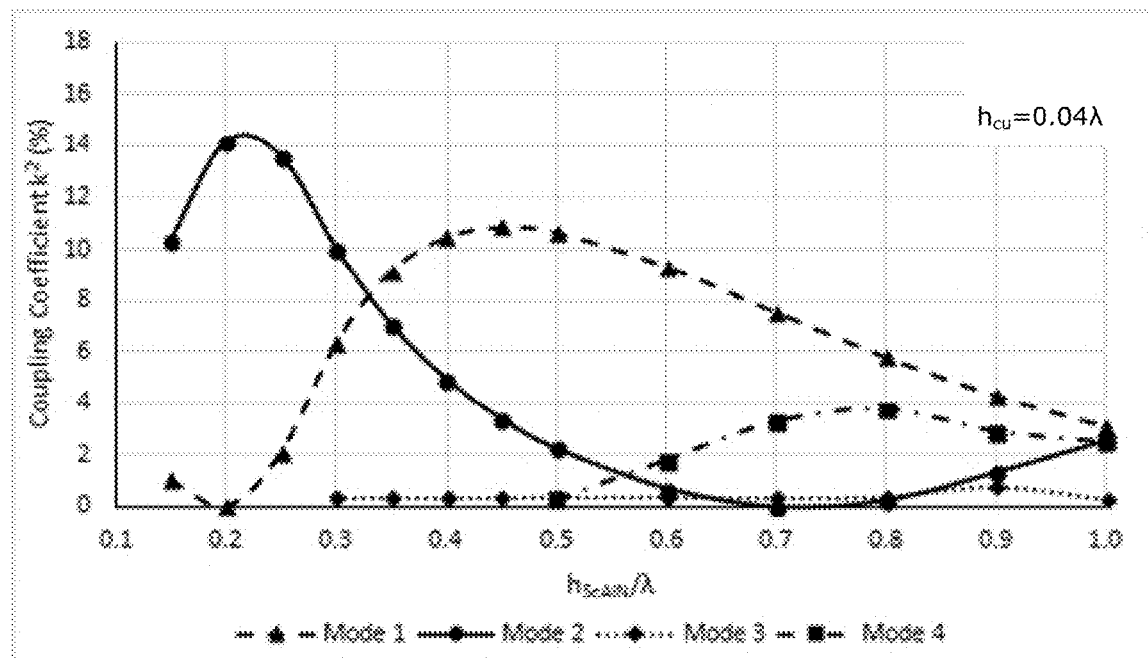
Figure 4D:
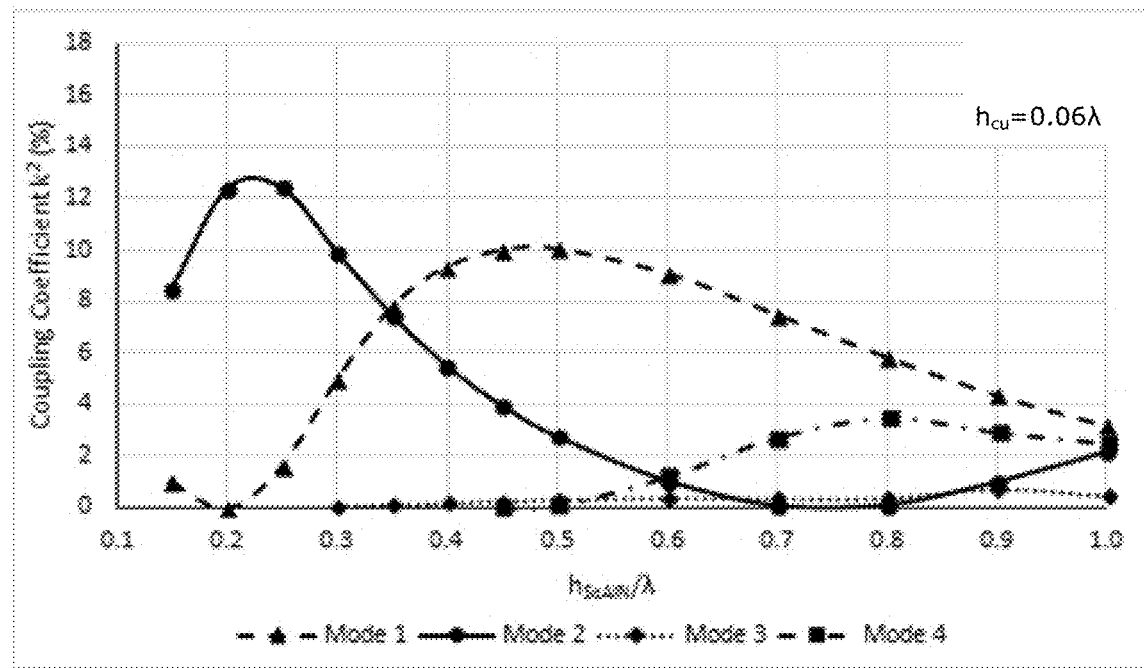
Figure 4E:
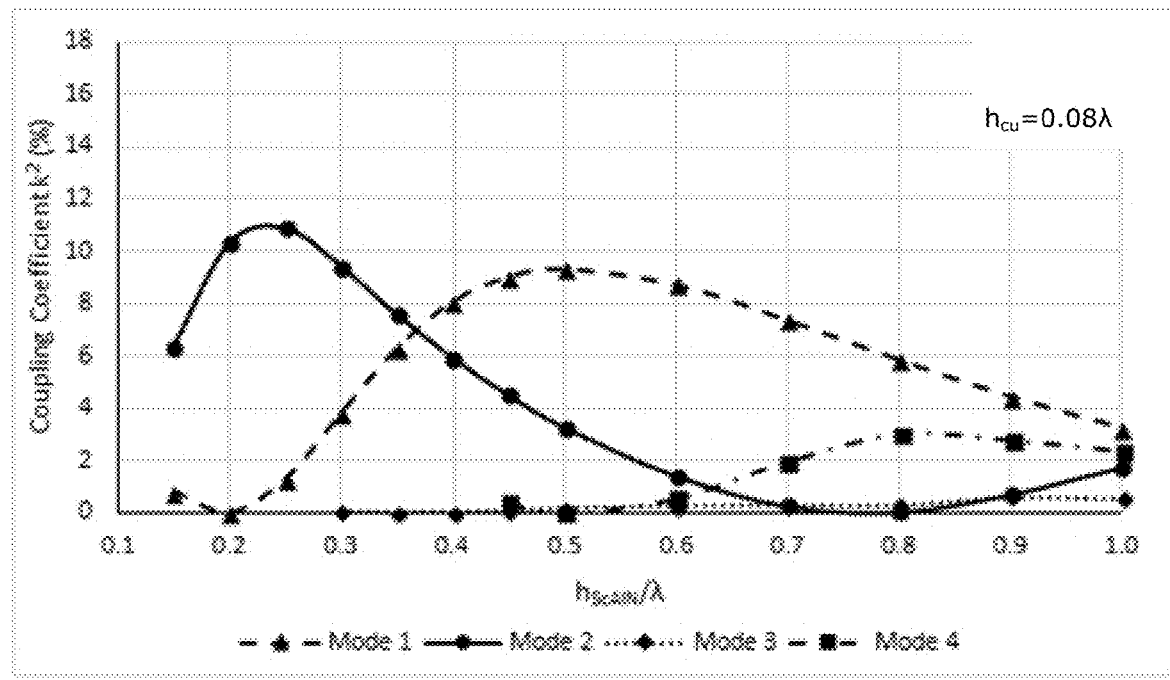
Figure 4F:
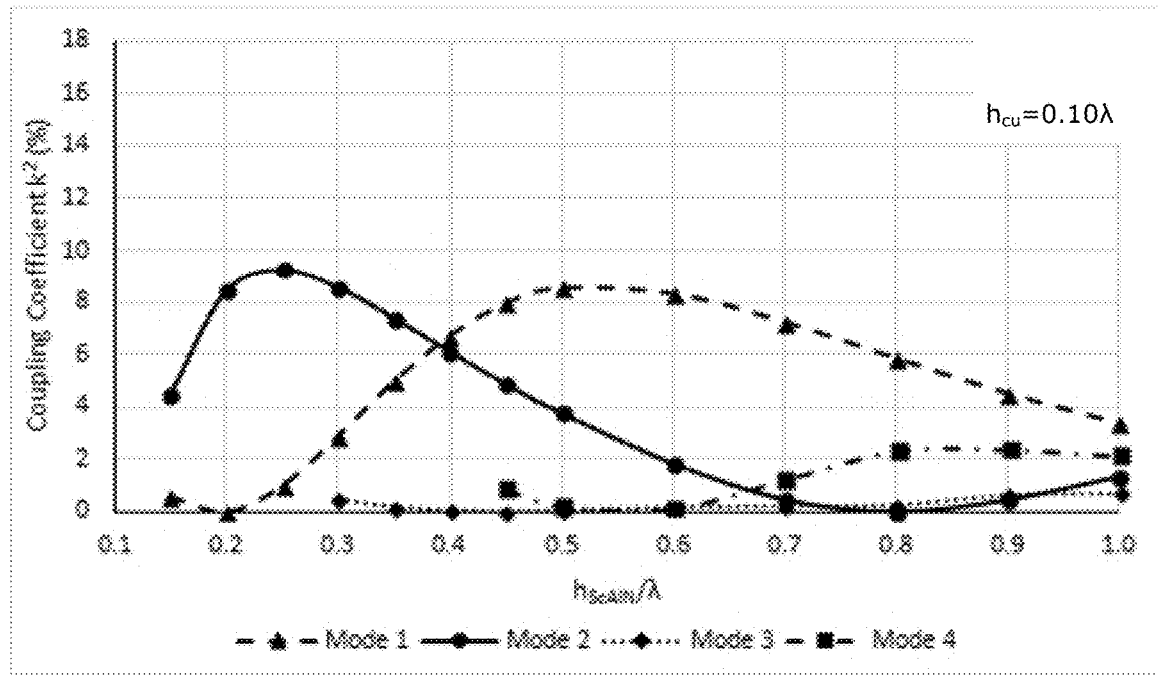

For example in FIG. 4A, a maximum piezoelectric layer electromechanical coupling coefficient ($k^2$) of 17.5% for a Sezawa wave mode at a piezoelectric layer 204 thickness of $0.2\lambda$ was found to be achieved. In addition, the other wave modes (e.g. modes 1, 3, and 4) exhibit approximately zero electromechanical coupling at this thickness of piezoelectric layer 204 limiting spurious signals from these other wave modes. By placing the metallic surface 202 on top of the buried IDT electrodes 108, the $k^2$ was found to increase to 17.5% (for the Sezawa wave) from 12.48% (Rayleigh mode), permitting the SAW device 100 to have a wider bandwidth. By placing the metallic surface 202 on top of the buried IDT electrodes 108, the thickness of the piezoelectric layer that corresponds to the maximum $k^2$ reduced from $0.5\lambda$ to $0.2\lambda$, which increase the acoustic wave phase velocity from 4260 m/s (Rayleigh mode) to 8832 m/s (Sezawa mode). This increase in phase velocity may enable higher operating frequency for higher frequency applications. Also by placing the metallic surface 202 on top of the buried IDT electrodes 108, the $k^2$ for unwanted other modes may be approximately zero as observed in FIG. 4A. This enables smaller spurious noises in the filter performance. This range was found to occur in this embodiment when the thickness of the piezoelectric layer 204 was between approximately $0.15\lambda$ and approximately $0.25\lambda$.

Also with reference to FIG. 4A, for a Rayleigh wave mode (mode 1), a maximum $k^2$ of approximately 13.29% at a piezoelectric layer 204 thickness of $0.4\lambda$ was found to be achieved. Although the electromechanical coupling coefficient $k^2$ for Rayleigh mode is very high at 13.29% at this $h_{ScAlN}/\lambda=0.4$, the coupling coefficient $k^2$ for the $2^{nd}$ Sezawa mode is not negligible at about 4%. The Sezawa mode wave may be exhibited in frequency spectrum as spurious signal and degrade the SAW device 100 performance when using the Rayleigh wave mode. One may choose a lower $k^2$ of approximately 12.43% for the Rayleigh wave mode at a thickness of the piezoelectric layer 206 of $0.5\lambda$ where the other wave modes are less than about 2 percent limiting the spurious signals.

Figure 5:
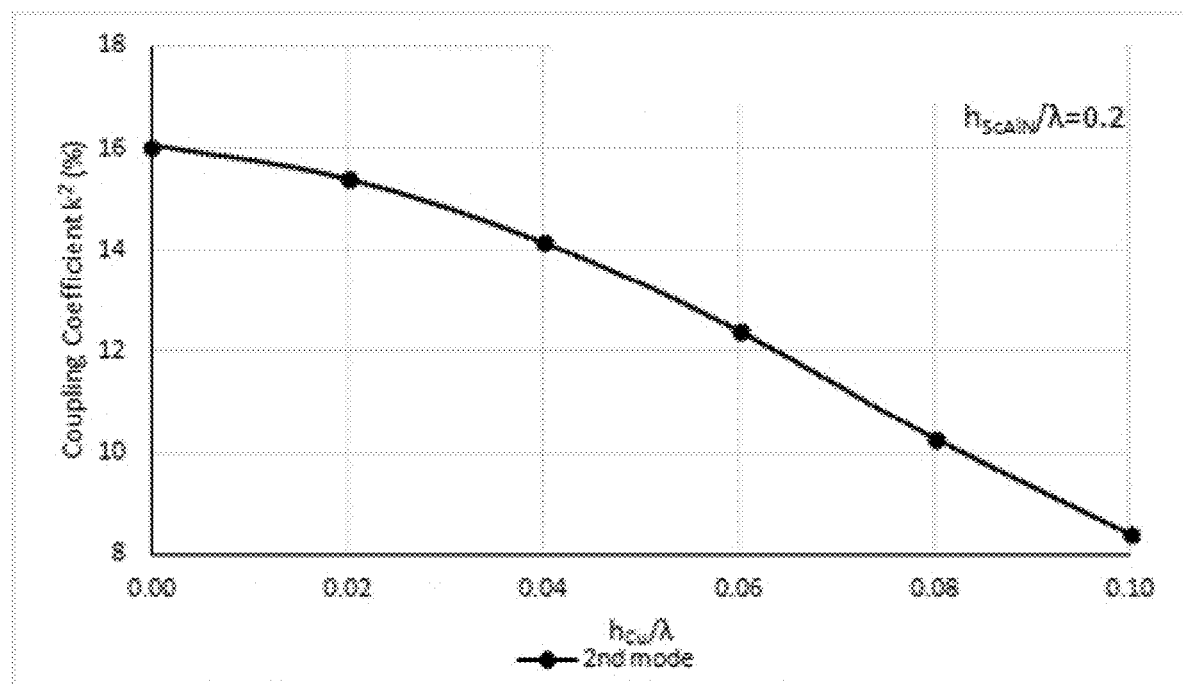
FIG. 5 is a simulated plot of the coupling coefficient versus the interdigital electrode height for the second wave mode for the example presented in FIG. 2.

FIG. 5 demonstrates a simulated plot of the coupling coefficient versus the IDT electrode 108 thickness for the Sezawa wave mode at a piezoelectric layer 204 thickness of $0.2\lambda$. As the thickness of the IDT electrode increases from $0\lambda$ to $0.1\lambda$, the coupling coefficient decreases from approximately 16% to approximately 8.4%.

Figure 3:
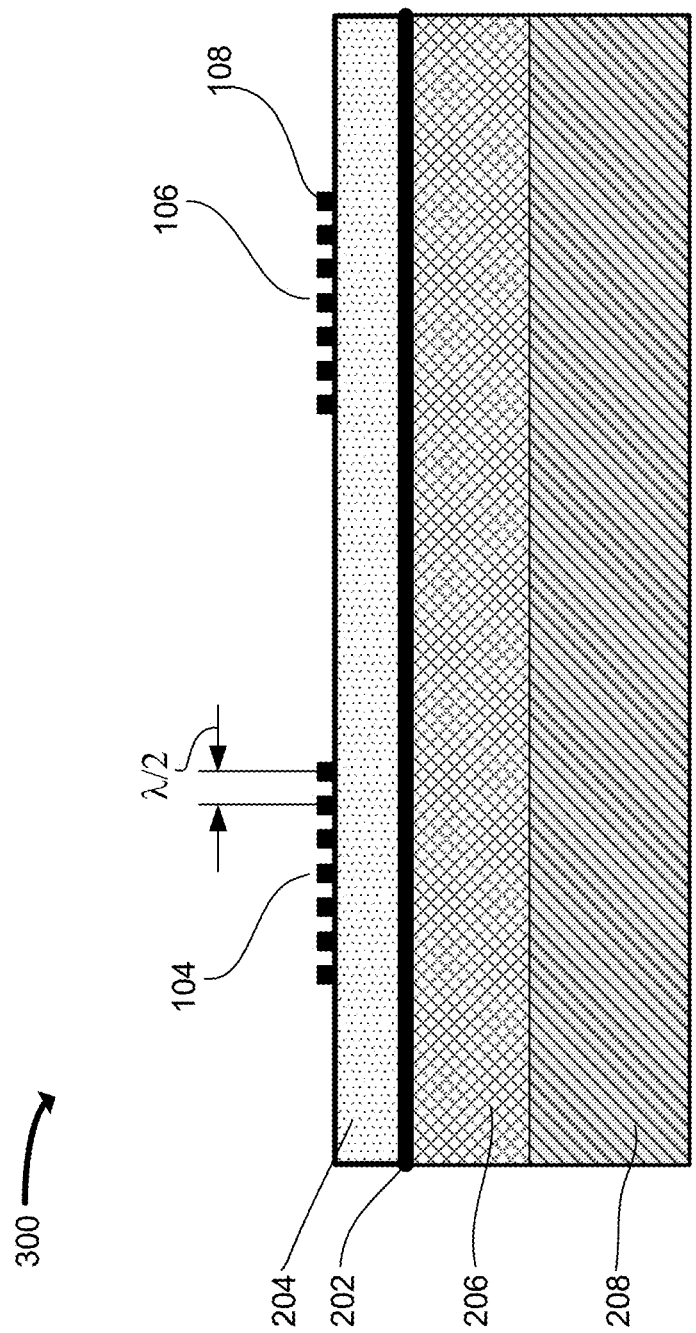
FIG. 3 is a side cross-section view of another example SAW filter.

In another embodiment shown in FIG. 3, instead of the metallic surface 202 as the top layer, the metallic surface 202 may be between the piezoelectric layer 204 and the high acoustic velocity layer 206. The IDT electrodes 108 may then be placed on top of the piezoelectric layer 204. The properties of the various layers are similar to those described with reference to FIG. 2 above.

For the embodiment demonstrated in FIG. 3, a simulation was conducted using COMSOL Multiphysics as previously described with the physical layer configuration changed according to that of FIG. 3. As observed from the results presented in FIG. 6, the embodiment was found to have a coupling coefficient of between approximately 4.9% and approximately 8.3% for a Sezawa wave mode when the piezoelectric layer 204 thickness is approximately $0.8\lambda$ and the IDT electrode 108 thickness is between approximately 0λ and approximately 0.10λ as demonstrated in FIG. 7. FIG. 7 also demonstrates that the coupling coefficient for the other wave modes may be negligible across this entire range.

Figure 6:
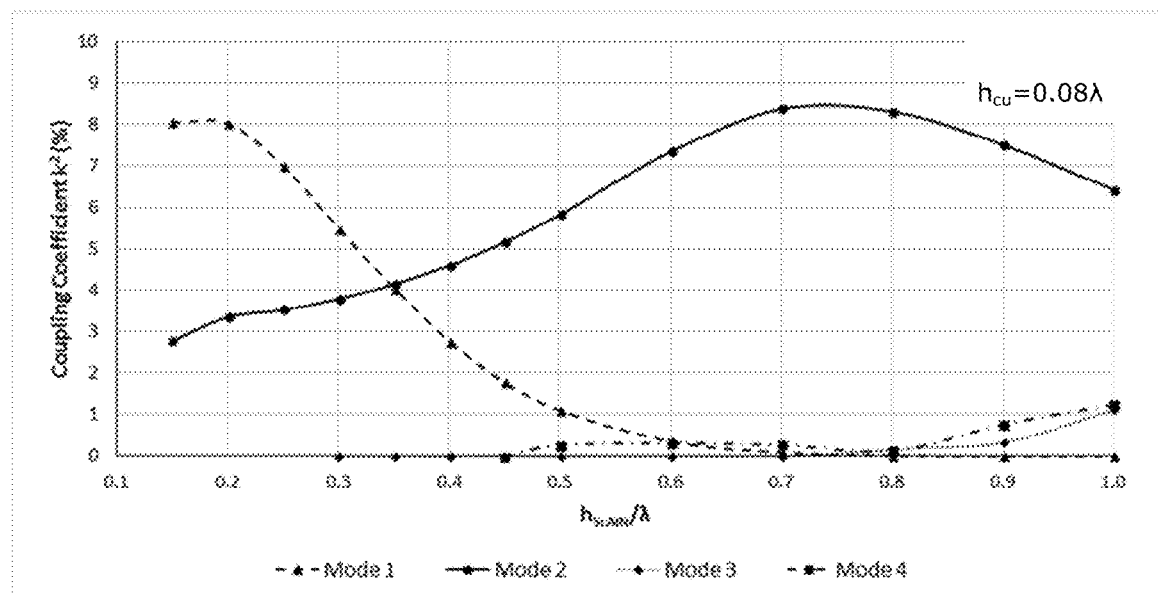
FIG. 6 is a simulated plot of the coupling coefficient versus the height of the scandium-doped Aluminum Nitride (ScAlN) layer for four wave modes for the example presented in FIG. 3.
Figure 7:
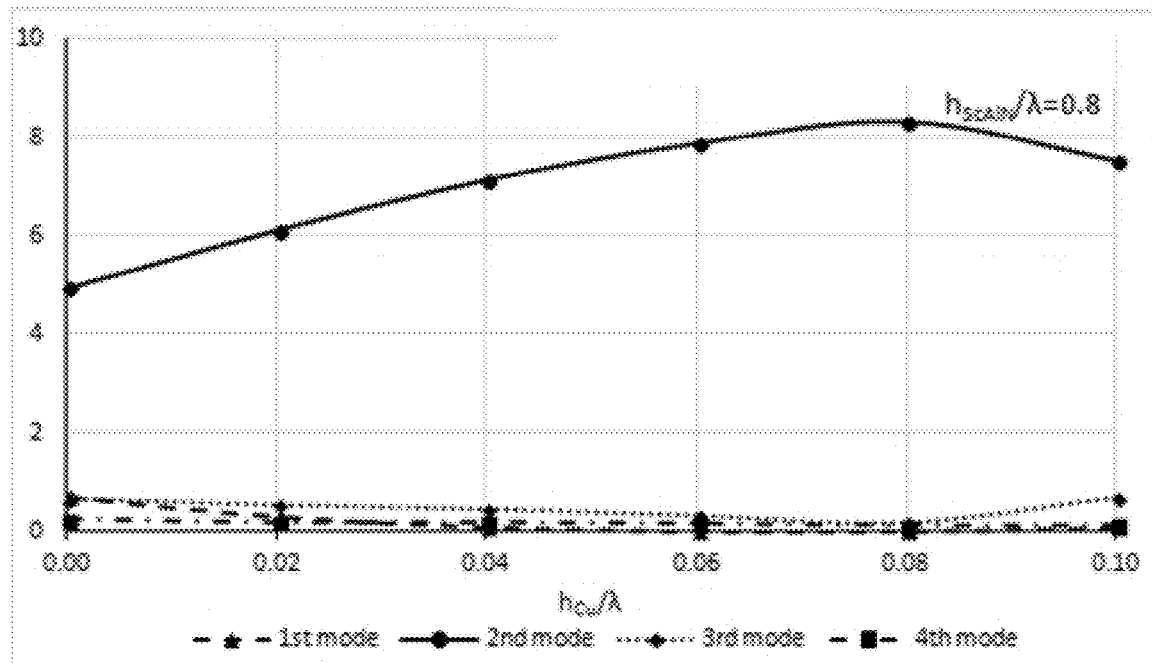
FIG. 7 is a simulated plot of the coupling coefficient versus the interdigital electrode height for four wave modes for the example presented in FIG. 3.

In another embodiment, it may be observed from FIG. 6 that the thickness of the piezoelectric layer 204 may be between approximately 0.65λ and approximately 0.85λ and the thickness of the IDT electrodes 108 may be between approximately 0.06λ and approximately 0.09λ (for copper electrodes). In this range, the coupling coefficient for the other wave modes is below approximately 1% and the Sezawa wave may have an electromechanical coupling coefficient larger than 8%. In another embodiment, a $k^2$ of approximately 8.43% for a Sezawa wave mode at a piezoelectric layer 204 thickness of 0.73λ may be achieved for an IDT electrode 108 thickness of 0.08λ (for copper electrodes).

By placing the metallic surface 202 at the interface of piezoelectric layer 204 and the high acoustic velocity diamond layer 206, the $k^2$ of Sezawa mode was found to increase from approximately 5.48% using prior methods to approximately 8.43% permitting the SAW device 100 to have a wider bandwidth.

Figure 8:
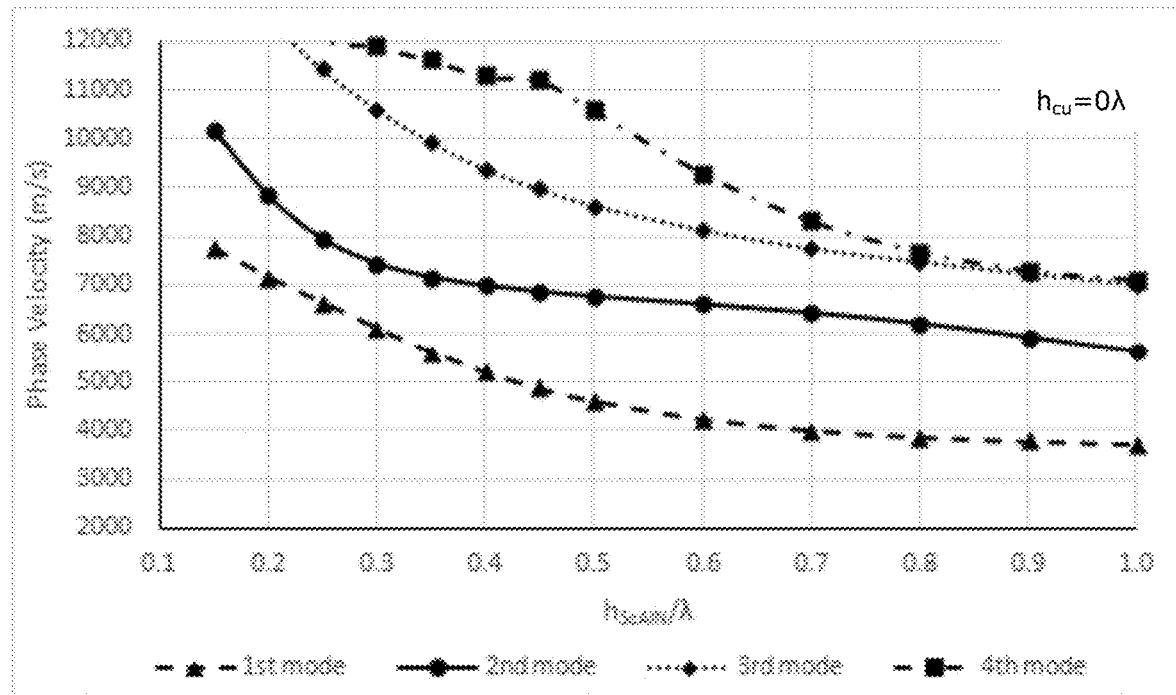
FIG. 8 is a simulated plot of the SAW velocity from the example of FIG. 2 for four wave modes.
Figure 9:
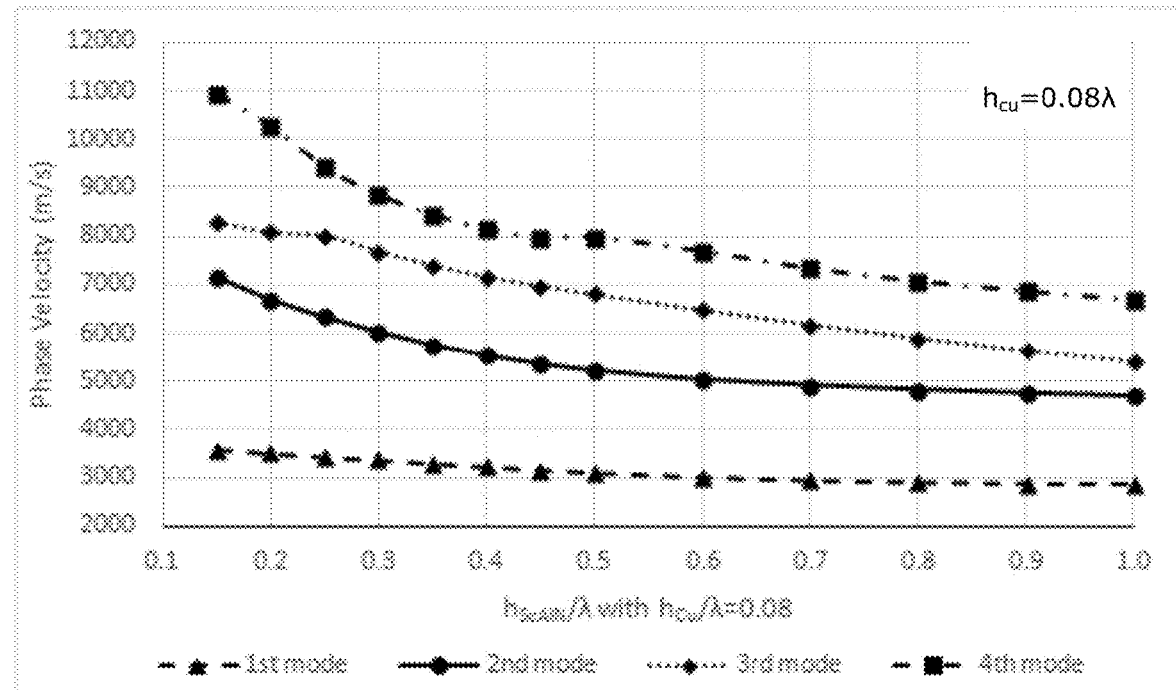
FIG. 9 is a simulated plot of the SAW velocity from the example of FIG. 3 for four wave modes.

FIGS. 8 and 9 present simulation graphs of the wave velocity for piezoelectric layer 204 thicknesses of 0.15λ to 1.0λ for the IDT electrode 108 thicknesses of approximately 0λ and 0.08λ respectively. Four wave modes are presented in each of FIGS. 8 and 9. The IDT electrode 108 thickness and the piezoelectric layer 204 thickness may affect the wave velocity according to these simulated results. For example, when the piezoelectric layer 204 and IDT electrodes 108 are thin (e.g. $h_{ScAlN}/\lambda=0.2$ and $h_{Cu}/\lambda<0.06$) such as in the simulation results from FIGS. 4A to 4C, the wave velocity is very high. For example, in FIG. 8, the wave velocity for a Sezawa wave is between approximately 8,000 m/s and approximately 10,000 m/s for the piezoelectric layer 204 thickness of between approximately 0.15λ and 0.25λ. When thicker layers are used, the wave velocity is much lower. For example, as may be observed in FIG. 9, the velocity for the Sezawa wave may be approximately 5000 m/s for a piezoelectric layer 204 thickness in the range of approximately 0.7λ to approximately 0.8λ with an IDT electrode 108 thickness of approximately 0.08λ.

In FIG. 6 a maximum $k^2$ of approximately 8.10% for a Rayleigh wave mode at a piezoelectric layer 204 thickness of 0.18λ was found to be achieved, however the coupling coefficient $k^2$ for the Sezawa ($2^{nd}$) mode is not negligible at about 3.5%. This Sezawa mode may show up at frequency spectrum as spurious signal and degrade the device performance. Further electromechanical coupling coefficients were found to be achieved by adjusting the height of the piezoelectric layer 204 and the wavelength as is observed with respect to the simulated results presented in FIG. 6.

Figure 11:
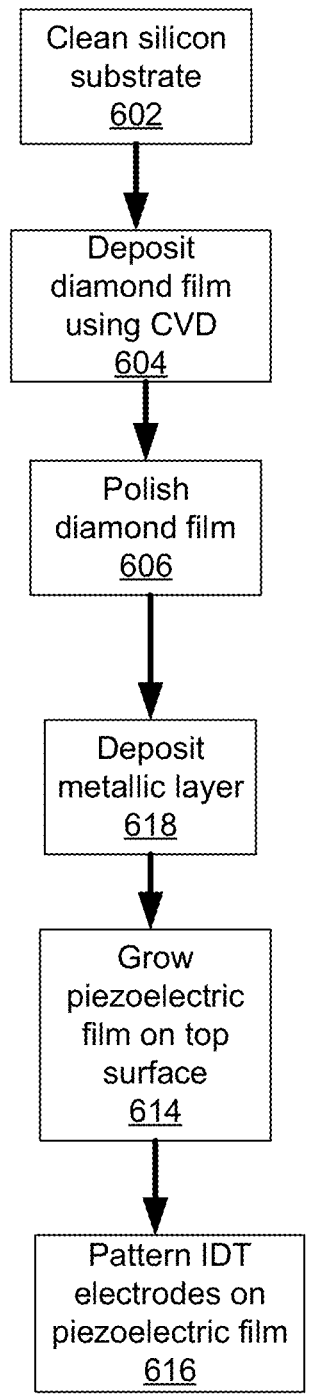
FIG. 11 is a flowchart demonstrating an example method of manufacture of the example SAW filter presented in FIG. 3.

An example manufacturing process for the SAW filters discussed above is generally described with reference to FIG. 10 for the embodiment using buried electrodes 108 (e.g., as shown in FIG. 2) and FIG. 11 for the embodiment using unburied electrodes 108 (e.g., as shown in FIG. 3). Common steps may be described once and differences may be indicated where applicable. Although certain techniques may be described below, any suitable thin film or semiconductor manufacturing techniques may be used. The base layer 208 may comprise a cleaned silicon substrate (step 602) where a multi-crystalline diamond thin film may be deposited as a high acoustic velocity layer 206 using chemical vapor deposition (CVD) (step 604). The high acoustic velocity layer 206 may be deposited to a thickness greater than the operating wavelength, such as for example 3λ. Following CVD, the high acoustic velocity layer 206 may be polished to a surface roughness significantly less than the operating wavelength, such as for example less than 3-nm root-mean squared (rms) (step 606). The smoother the polished surface, the better the SAW propagation may be as the smoother surface may have less propagation loss.

When the IDT electrodes 108 are buried, such as in the embodiment of FIG. 2, the IDT electrodes 108 pattern may then be patterned on the high acoustic velocity layer 206 at step 610 using standard photolithography and/or direct e-beam writing technology with metal, such as aluminum (Al), copper (Cu), platinum (Pt), Aluminum-copper alloys (Al/Cu/Al), or other metals or alloys. In this embodiment, copper IDT electrodes 108 are demonstrated. For the piezoelectric layer 204, a thin film may then be grown on top of the IDT/diamond thin film 206 using reactive pulsed direct current (DC) sputtering with high purity Sc—Al alloy target at step 612.

At step 618, a metallic layer 202, such as aluminum, may be deposited on top of the piezoelectric layer 204 and is electrically isolated from the input transducer 104 and output transducer 106. The metallic layer 202 may be evaporated using vacuum evaporation or sputtered using various sputtering techniques. The result of this example process is that the IDT electrodes 108 are buried within the piezoelectric layer 204 and the piezoelectric layer 204 is overlaid with a metallic layer 202.

When the IDT electrodes 108 are not buried IDT electrodes 108, as demonstrated in FIG. 3, then the metallic layer 202 may be applied to the surface of the high acoustic velocity layer 206 as previously described in step 618. The piezoelectric layer 204 may then be deposited on top of the metallic layer 206 in step 614 using reactive pulsed DC sputtering or other techniques such as, for example, dual RF magnetron reactive co-sputtering, RF magnetron sputtering, DC reactive magnetron sputtering, or High power impulse magnetron sputtering (HiPIMS) with co-sputtering. The IDT electrodes 108 may be patterned at step 616 on the piezoelectric layer 204 rather than the high acoustic velocity layer 206. The result of this example process is that the IDT electrodes 108 are present on the surface of the piezoelectric layer 204 and the metallic layer 202 underlies the piezoelectric layer 204.

Although the embodiments described herein disclose a SAW filter, the techniques herein may also be applied to SAW resonators, duplexers, filters, sensors, etc. The particular advantages described herein may benefit any SAW device requiring high electromechanical coupling and/or uses a Sezawa wave mode to function.

Although the transducers 104 and 106 may be described herein as input and output transducers, it may be understood that the SAW device 100 may be bidirectional and specifying input and output was merely labeled for ease of reference. Although the embodiments herein demonstrate two transducers for the SAW device, other embodiments may have a single transducer or a plurality of transducers. Although the embodiments herein demonstrate only transducer structures, other embodiments may comprise reflectors.

Although the example embodiments described herein refer to ScAlN, the doping concentrations of Sc in the ScAlN film between about 40-45 at % may provide the highest electromechanical coupling coefficient.

Although CVD may been described herein for growing a diamond layer, other embodiments may use any suitable deposition technique including, for example, plasma enhanced CVD (PECVD), Hot filament CVD (HFCVD), microwave plasma enhanced CVD (MPCVD). Single crystal diamond substrate may also use a high pressure, high temperature (HPHT) method.

Although the IDT electrodes 108 herein may be described as using a metal such as aluminum (Al), copper (Cu), platinum (Pt), and/or Aluminum-copper alloys (Al/Cu/Al), the electrodes 108 may be made of any suitable material including, for example, molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

Although the base layer 208 and high acoustic velocity layer 206 described herein may be two separate layers, these two layers may be replaced using a single crystal diamond substrate. In other example embodiments, the base layer 208 may not be silicon but may be another material that provides mechanical support for the high acoustic velocity layer 206. Silicon may be selected because it is a common substrate used in the semiconductor industry, a relatively low cost material, and/or a widely available material. Silicon may be replaced with other substrate materials as long as the high acoustic velocity layer 206 may be effectively grown on the base layer 208. In particular, for a diamond thin film, the silicon material may provide advantages over other types of materials.

In other example embodiments, the base layer 208 may be removed in the final device fabrication state (e.g. leaving only layers 202, 204, and 206), if so desired, as long as the high acoustic velocity layer 206 has sufficient strength to support itself and the other remaining components of the device 100. It may be useful to remove the base layer 208 in order to achieve a thinner device 100, for example for sensor application.

Although the metallic layer 202 herein is described as using a metal such as aluminum (Al), other metals may be suitable such as copper (Cu), platinum (Pt), and/or Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), and/or alloys comprising any number of these metals.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of IDT electrodes 108 are disclosed herein, other sizes and shapes may be used. In another example, although a particular SAW device 100 (e.g. filter) may be described herein, the structures described may be adapted to other SAW device configurations.

The thicknesses of each of the layers 200 and 300 described herein are meant to be illustrative and not restrictive. The figures may exaggerate or minimize the height of these layers for illustrative purposes and/or for ease of reference.

Although the example embodiments may be described with reference to a particular orientation (e.g. top and base), this was simply used as a matter of convenience and ease of reference in describing the figures.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave device comprising:
a high acoustic velocity layer;
a piezoelectric layer coupled to the high acoustic velocity layer;
at least one transducer between the piezoelectric layer and the high acoustic velocity layer, the at least one transducer being configured to propagate a surface acoustic wave having an operating wavelength ($\lambda$) along a surface of the piezoelectric layer, each of the at least one transducer having a plurality of interdigital transducer (IDT) electrodes, the IDT electrodes each having an IDT thickness; and
a thin metallic layer coupled to the piezoelectric layer and electrically isolated from the at least one transducer;
wherein the piezoelectric layer is a scandium-doped aluminum-nitride (ScAlN) layer; and
wherein the thickness of the piezoelectric layer is approximately $0.15\lambda$-$0.25\lambda$ and the IDT thickness is less than $0.02\lambda$.

2. The surface acoustic wave device according to claim 1, wherein the metallic layer is formed from at least one of aluminum (Al), copper (Cu), platinum (Pt), Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), or zirconium (Zr).

3. The surface acoustic wave device according to claim 1, further comprising a base layer coupled to the high acoustic velocity layer.

4. The surface acoustic wave device according to claim 3, wherein the base layer comprises a silicon substrate.

5. The surface acoustic wave device according to claim 1, wherein a first electromechanical coupling coefficient ($k^2$) of the surface acoustic wave device is between approximately 13% and approximately 18% for a Sezawa wave mode, and a second $k^2$ of the surface acoustic wave device for a Rayleigh wave mode is approximately zero.

6. The surface acoustic wave device according to claim 1, wherein the scandium-doping is between approximately 40 to approximately 45 atomic percent.

7. The surface acoustic wave device according to claim 1, wherein the high acoustic velocity layer comprises a diamond layer.

8. The surface acoustic wave device according to claim 7, wherein the diamond layer has a thickness greater than the operating wavelength.

9. The surface acoustic wave device according to claim 1, wherein the high acoustic velocity layer has an acoustic velocity between approximately 8,000 m/s and approximately 10,000 m/s.

10. The surface acoustic wave device according to claim 1, wherein the at least one transducer comprises an input transducer and an output transducer, and wherein the metallic layer overlaps both the input transducer and the output transducer, the metallic layer extends between the input transducer and the output transducer, and the metallic layer is electrically isolated from both the input transducer and the output transducer.

11. The surface acoustic wave device according to claim 1, wherein the device is a filter.

12. The surface acoustic wave device according to claim 1, wherein the device is a resonator.

13. The surface acoustic wave device according to claim 1, wherein the metallic layer extends over an entire area of the piezoelectric layer.

14. The surface acoustic wave device according to claim 1, wherein the IDT electrodes are formed from at least one of aluminum (Al), copper (Cu), platinum (Pt), Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), zirconium (Zr), or alloys thereof.

15. The surface acoustic wave device according to claim 14, wherein the IDT electrodes are formed from copper.

16. The surface acoustic wave device according to claim 1, wherein the thickness of the piezoelectric layer is approximately 0.2λ, and the IDT thickness is approximately 0.01λ.

17. The surface acoustic wave device according to claim 16, wherein the thickness of the piezoelectric layer is approximately 0.65λ-0.85λ and the IDT thickness is approximately 0.07λ-0.09λ.

18. A method of manufacturing a surface acoustic wave (SAW) device, the method comprising:
providing a high acoustic velocity layer;
providing at least one transducer on the high acoustic velocity layer, the transducers configured to propagate or receive a surface acoustic wave and having an operating wavelength (λ), each of the at least one transducer having a plurality of interdigital transducer (IDT) electrodes, the IDT electrodes each having an IDT thickness;
providing a piezoelectric layer over the at least one transducer and the high acoustic velocity layer; and
providing a thin metallic layer on the piezoelectric layer;
wherein the piezoelectric layer is a scandium-doped aluminum-nitride (ScAlN) layer; and
wherein the thickness of the piezoelectric layer is approximately 0.15λ-0.25λ and the IDT thickness is less than 0.02λ.

19. The method according to claim 18, wherein the high acoustic velocity layer is provided to a thickness greater than the operating wavelength.

20. The method according to claim 18, wherein a first electromechanical coupling coefficient of the SAW device is between approximately 13% and approximately 18% for a Sezawa wave mode, and a second electromechanical coupling coefficient of the SAW device for a Rayleigh wave mode is approximately zero.

21. A surface acoustic wave device comprising:
a high acoustic velocity layer;
a piezoelectric layer coupled to the high acoustic velocity layer;
at least one transducer coupled to a first surface of the piezoelectric layer, the at least one transducer being configured to propagate a surface acoustic wave having an operating wavelength (λ) along a surface of the piezoelectric layer, each of the at least one transducer having a plurality of interdigital transducer (IDT) electrodes, the IDT electrodes each having an IDT thickness; and
a thin metallic layer coupled to a second surface of the piezoelectric layer and between the piezoelectric layer and the high acoustic velocity layer, the metallic layer being electrically isolated from the at least one transducer;
wherein the piezoelectric layer is a scandium-doped aluminum-nitride (ScAlN) layer; and
wherein the thickness of the piezoelectric layer is approximately 0.65λ-0.85λ and the IDT thickness is approximately 0.06λ-0.09λ.

22. The surface acoustic wave device according to claim 21, wherein the metallic layer is formed from at least one of aluminum (Al), copper (Cu), platinum (Pt), Aluminum-copper alloys (Al/Cu/Al), molybdenum (Mo), tungsten (W), titanium (Ti), gold (Au), nickel (Ni) and titanium nitride (TiN), and silver (Ag), cobalt (Co), chromium (Cr), copper-iron alloy (Cu—Fe), niobium (Nb), nickel (Ni), zinc (Zn), or zirconium (Zr).

23. The surface acoustic wave device according to claim 21, further comprising a base layer coupled to the high acoustic velocity layer, wherein the base layer comprises a silicon substrate.

24. The surface acoustic wave device according to claim 21, wherein the high acoustic velocity layer comprises a diamond layer having a thickness greater than the operating wavelength.

25. The surface acoustic wave device according to claim 21, wherein the at least one transducer comprises an input transducer and an output transducer, and wherein the metallic layer overlaps both the input transducer and the output transducer, the metallic layer extends between the input transducer and the output transducer, and the metallic layer is electrically isolated from both the input transducer and the output transducer.

26. The surface acoustic wave device according to claim 21, wherein the scandium-doping is between approximately 40 to approximately 45 atomic percent.

27. The surface acoustic wave device according to claim 21, wherein a first electromechanical coupling coefficient ($k^2$) of the surface acoustic wave device is greater than 8% for a Sezawa wave mode, and a second $k^2$ of the surface acoustic wave device for a Rayleigh wave mode is below 1%.

* * * * *